(12) United States Patent
Lee et al.

(10) Patent No.: US 9,847,510 B2
(45) Date of Patent: *Dec. 19, 2017

(54) ORGANIC LIGHT EMITTING DIODE DISPLAY APPARATUS

(71) Applicant: SAMSUNG SDI CO., LTD., Yongin-si, Gyeonggi-do (KR)

(72) Inventors: Ji Yeon Lee, Suwon-si (KR); Seong Ryong Nam, Suwon-si (KR); Sung Min Ko, Suwon-si (KR); Mi Sun Kim, Suwon-si (KR); Hye Jin Kim, Suwon-si (KR); Mi Jeong Choi, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/094,049

(22) Filed: Apr. 8, 2016

(65) Prior Publication Data

US 2016/0372707 A1 Dec. 22, 2016

(30) Foreign Application Priority Data

Jun. 19, 2015 (KR) ........................ 10-2015-0087823

(51) Int. Cl.
*H01L 51/52* (2006.01)
(52) U.S. Cl.
CPC .............................. *H01L 51/5256* (2013.01)
(58) Field of Classification Search
None
See application file for complete search history.

(56) References Cited

U.S. PATENT DOCUMENTS

| | | | |
|---|---|---|---|
| 9,093,666 B2 * | 7/2015 | Young | H01L 51/5237 |
| 2008/0278070 A1 | 11/2008 | Kim | |
| 2015/0252125 A1 * | 9/2015 | Moro | C08F 230/08 |
| | | | 428/447 |

FOREIGN PATENT DOCUMENTS

| | | |
|---|---|---|
| KR | 10-2011-0071039 A | 6/2011 |
| WO | WO 2014/109455 A1 | 7/2014 |

OTHER PUBLICATIONS

U.S. Appl. No. 15/094,091, filed Apr. 8, 2016.
USPTO Office action dated Mar. 2, 2017, in U.S. Appl. No. 15/094,091.

* cited by examiner

*Primary Examiner* — Michelle Mandala
(74) *Attorney, Agent, or Firm* — Lee & Morse, P.C.

(57) ABSTRACT

Disclosed is an organic light emitting diode display apparatus including: a substrate; an organic light emitting diode disposed on the substrate; and an encapsulation layer encapsulating the organic light emitting diode. The encapsulation layer has a structure in which two or more inorganic layers and one or more organic layers are alternately stacked one above another, two adjacent inorganic layers at least partially contact each other, and the organic layers are formed of an encapsulating composition. The encapsulating composition includes: about 10 wt % to about 70 wt % of (A) a non-silicon-based di(meth)acrylate, about 20 wt % to about 70 wt % of (B) a silicon-based di(meth)acrylate, about 5 wt % to about 40 wt % of (C) a mono(meth)acrylate, and about 1 wt % to about 10 wt % of (D) an initiator, the (B) silicon-based di(meth)acrylate being represented by Formula 1.

15 Claims, 1 Drawing Sheet

ORGANIC LIGHT EMITTING DIODE DISPLAY APPARATUS

CROSS-REFERENCE TO RELATED APPLICATION

This application claims the benefit of Korean Patent Application No. 10-2015-0087823, filed on Jun. 19, 2015 in the Korean Intellectual Property Office, the entire disclosure of which is incorporated herein by reference.

FIELD OF THE INVENTION

The present invention relates to an organic light emitting diode display apparatus.

DESCRIPTION OF THE RELATED ART

Organic light emitting diodes are vulnerable to moisture and/or gas. Organic light emitting diodes can suffer from delamination at an interface between a metal field and a light emitting layer due to moisture. The organic light emitting diodes can have high resistance due to oxidation of metals and can suffer from degradation of organic materials in the light emitting layer due to moisture and/or oxygen. The organic light emitting diode can suffer from deterioration in light emission due to oxidation of the light emitting layer or the metal field by outgassing inside or outside the organic light emitting diodes. Thus, the organic light emitting diode must be encapsulated by an encapsulation composition capable of protecting the organic light emitting diode from moisture and/or gas.

The organic light emitting diode can be encapsulated by an encapsulation layer having a multilayer structure in which organic layers and inorganic layers are alternately stacked one above another. The organic layers can be formed by plasma deposition. However, the organic layers can be etched by plasma. Etching of the organic layers can deteriorate an encapsulation function of the organic layers and provide adverse influence on formation of the inorganic layers. Each of the organic layers is formed between two adjacent inorganic layers. If the organic layers exhibit low resistance to plasma, there can be difficulty in formation of the inorganic layers. As a result, the organic light emitting diode can suffer from deterioration in luminous characteristics and reliability.

The encapsulation layer includes a plurality of inorganic layers on a substrate. Thus, the encapsulation layer can suffer from slight lifting between the inorganic layers and/or delamination or slight lifting between the substrate and the inorganic layer. As a result, the inorganic layers cannot sufficiently prevent moisture and/or oxygen from penetrating the organic light emitting diode.

The background technique of the present invention is disclosed in Korean Patent Laid-open Publication No. 2011-0071039.

SUMMARY OF THE INVENTION

It is one aspect of the present invention to provide an organic light emitting diode display apparatus that includes an organic layer exhibiting high plasma resistance.

It is another aspect of the present invention to provide an organic light emitting diode display apparatus that includes an organic layer having considerably low water vapor permeability and oxygen permeability.

It is a further aspect of the present invention to provide an organic light emitting diode display apparatus that includes an organic layer exhibiting excellent transparency.

It is yet another aspect of the present invention to provide an organic light emitting diode display apparatus that includes an organic layer capable of securing reliability in elapsed time by protecting the organic light emitting diode display apparatus from surroundings including moisture and gas.

It is yet another aspect of the present invention to provide an organic light emitting diode display apparatus, in which an organic layer more vulnerable to moisture and/or oxygen than an inorganic layer is formed so as not to be exposed at an edge of the encapsulation layer, thereby improving reliability in elapsed time.

It is yet another aspect of the present invention to provide an organic light emitting diode display apparatus, in which two adjacent inorganic layers are formed to contact each other to prevent slight lifting and/or delamination between the inorganic layers or between a substrate and an inorganic layer, thereby suppressing permeation of moisture and/or oxygen into the encapsulation layer through an edge thereof.

In accordance with one aspect of the present invention, an organic light emitting diode display apparatus includes: a substrate; an organic light emitting diode disposed on the substrate; and an encapsulation layer encapsulating the organic light emitting diode, wherein the encapsulation layer has a structure in which two or more inorganic layers and one or more organic layers are alternately stacked one above another, two adjacent inorganic layers at least partially contact each other, and the organic layers are formed of an encapsulating composition, and wherein the encapsulating composition includes: about 10 wt % to about 70 wt % of (A) a non-silicon-based di(meth)acrylate, about 20 wt % to about 70 wt % of (B) a silicon-based di(meth)acrylate, about 5 wt % to about 40 wt % of (C) a mono(meth)acrylate, and about 1 wt % to about 10 wt % of (D) an initiator, the (B) silicon-based di(meth)acrylate being represented by Formula 1:

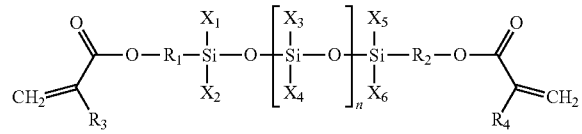

(where $R_1$, $R_2$, $R_3$, $R_4$, $X_1$, $X_2$, $X_3$, $X_4$, $X_5$, $X_6$, and n are the same as defined in the following detailed description).

The present invention provides an organic light emitting diode display apparatus that includes an organic layer exhibiting high plasma resistance.

The present invention provides an organic light emitting diode display apparatus that includes an organic layer having considerably low water vapor permeability and oxygen permeability.

The present invention provides an organic light emitting diode display apparatus that includes an organic layer exhibiting excellent transparency.

The present invention provides an organic light emitting diode display apparatus that includes an organic layer capable of securing reliability in elapsed time by protecting the organic light emitting diode display apparatus from surroundings including moisture and gas.

The present invention provides an organic light emitting diode display apparatus, in which an organic layer more vulnerable to moisture and/or oxygen than an inorganic layer is formed so as not to be exposed at an edge of an encapsulation layer, thereby improving reliability in elapsed time.

The present invention provides an organic light emitting diode display apparatus, in which two adjacent inorganic layers are formed to contact each other to prevent slight lifting and/or delamination between the inorganic layers or between a substrate and an inorganic layer, thereby suppressing permeation of moisture and/or oxygen into an encapsulation layer through an edge thereof.

DETAILED DESCRIPTION OF THE INVENTION

Figure 1:
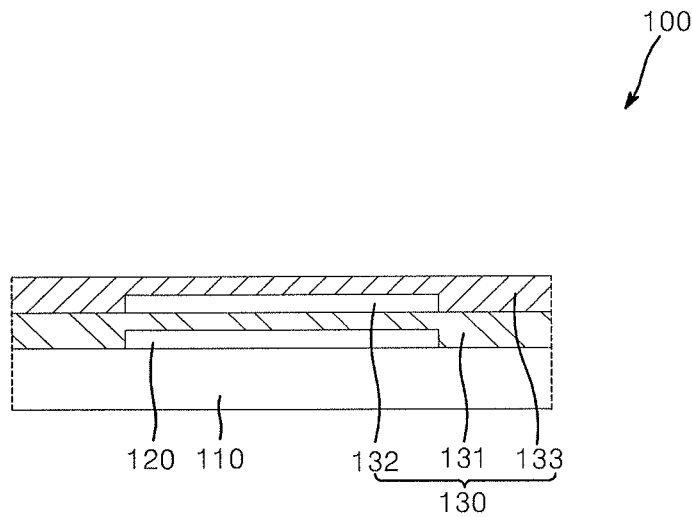
FIG. 1 is a sectional view of an organic light emitting diode display apparatus in accordance with one embodiment of the present invention.

Hereinafter, embodiments of the present invention will be described in detail with reference to the accompanying drawings. It should be understood that the present invention is not limited to the following embodiments and may be embodied in different ways, and that the following embodiments are given to provide complete disclosure of the invention and to provide a thorough understanding of the invention to those skilled in the art. It should be noted that the drawings are not to precise scale and some of the dimensions, such as width, length, thickness, and the like, are exaggerated for clarity of description in the drawings. Further, although only a portion of a component is illustrated for convenience of description, other portions of the component can become apparent to those skilled in the art. Furthermore, it should be understood that the present invention can be realized in various ways by those skilled in the art without departing from the spirit and scope of the invention.

As used herein, spatially relative terms such as "upper" and "lower" are defined with reference to the accompanying drawings. Thus, it will be understood that "upper" can be used interchangeably with "lower". It will be understood that when a layer is referred to as being "on" another layer, it can be directly formed on the other layer, or intervening layer(s) may also be present. Thus, it will be understood that when a layer is referred to as being "directly on" another layer, no intervening layer is interposed therebetween.

As used herein, the term "(meth)acryl" refers to acryl and/or methacryl.

Unless otherwise stated herein, the term "substituted" means that at least one hydrogen atom in a functional group is substituted with a halogen atom (for example (F, Cl, Br or I), a hydroxyl group, a nitro group, a cyano group, an imino group (=NH, =NR, R being a $C_1$ to $C_{10}$ alkyl group)), an amino group (—$NH_2$, —NH(R'), —N(R")(R'''), R', R" and R''' each being independently a $C_1$ to $C_{10}$ alkyl group), an amidino group, a hydrazine group, a hydrazone group, a carboxylic acid group, a $C_1$ to $C_{20}$ alkyl group, a $C_6$ to $C_{30}$ aryl group, a $C_3$ to $C_{30}$ cycloalkyl group, a $C_3$ to $C_{30}$ heteroaryl group, or a $C_2$ to $C_{30}$ heterocycloalkyl group.

As used herein, the term "aryl group" refers to a functional group in which all elements of a cyclic substituent have p-orbitals and these p-orbitals are conjugated. The aryl group includes monocyclic, non-fused polycyclic or fused polycyclic functional groups. Here, the term "fused" means that a pair of carbon atoms is shared by contiguous rings. The aryl group also includes biphenyl groups, terphenyl groups, or quaterphenyl groups, in which at least two aryl groups are connected to each other through a sigma bond. The aryl group may refer to a phenyl group, a naphthyl group, an anthracenyl group, a phenanthrenyl group, a pyrenyl group, a chrysenyl group, and the like.

As used herein, the term "heteroaryl group" refers to a functional group in which an aryl group contains 1 to 3 hetero atoms selected from the group consisting of N, O, S, P and Si, and the other atoms in the aryl group are carbon. The heteroaryl group also includes a functional group in which at least two heteroaryl groups are directly connected through a sigma bond. The heteroaryl group also includes a functional group in which at least two heteroaryl groups are fused. If the heteroaryl groups are fused, each ring may include 1 to 3 heteroatoms as set forth above. The heteroaryl group may refer to, for example, a pyridinyl group, a pyrimidinyl group, a pyrazinyl group, a pyridazinyl group, a triazinyl group, a quinolinyl group, an isoquinolinyl group, and the like.

More specifically, the $C_6$ to $C_{30}$ aryl group and/or the $C_3$ to $C_{30}$ heteroaryl group may be a substituted or unsubstituted phenyl group, a substituted or unsubstituted naphtyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted phenylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazoyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzothiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, or combinations thereof, without being limited thereto.

As used herein, the term "etching rate of an organic layer due to plasma" or "plasma etching rate" refers to a value calculated by Equation 2 after the following procedures: an initial height T1 (unit: μm) of an organic layer, which is formed by depositing an encapsulating composition to a predetermined thickness and photocuring the composition, is measured, followed by measuring height T2 (unit: μm) of the organic layer after plasma treatment under conditions of inductively coupled plasma (ICP) power: 2500 W, radio frequency (RF) power: 300 W, DC bias: 200 V, Ar flow: 50 sccm, etching time: 1 min and pressure: 10 mtorr. Here, the initial height (T1) of the organic layer may range from about 1 μm to about 10 μm. The value calculated by Equation 2 is inversely proportional to plasma resistance of the organic layer.

Etching rate of organic layer due to plasma (%)=
$(T1-T2)/T1 \times 100$ <Equation 2>

An organic light emitting diode display apparatus according to the present invention includes a substrate, an organic light emitting diode disposed on the substrate, and an encapsulation layer encapsulating the organic light emitting diode, wherein the encapsulation layer has a structure in which two or more inorganic layers and one or more organic layers are alternately stacked one above another, two adjacent inorganic layers at least partially contact each other, and the organic layers are formed of an encapsulating composition according to the present invention.

The encapsulating composition according to the present invention can realize an organic layer that has excellent plasma resistance, and has low roughness to secure excellent flatness. Accordingly, in the organic light emitting diode display apparatus according to the present invention, such an organic layer is formed between the inorganic layers to provide a flat encapsulation layer, thereby realizing a thin thickness of the encapsulation layer.

The encapsulating composition according to the present invention can realize an organic layer exhibiting significantly low water vapor permeability and oxygen permeability. Accordingly, the organic light emitting diode display apparatus according to the present invention can further prevent corrosion and deterioration in luminous efficiency of the organic light emitting diode due to permeation of external moisture and/or oxygen while improving reliability of the organic light emitting diode in elapsed time.

In the encapsulation layer according to the present invention, two adjacent inorganic layers may at least partially contact each other. Accordingly, the organic light emitting diode display apparatus according to the present invention can further suppress permeation of moisture and/or oxygen into the inorganic layers and can suppress delamination or slight lifting between the inorganic layers.

For example, in the organic light emitting diode display apparatus according to the present invention, the inorganic layers include a first inorganic layer and a second inorganic layer; the organic layer includes a first organic layer; and the encapsulation layer includes the first inorganic layer, the first organic layer, and the second inorganic layer alternately stacked one above another.

The encapsulation layer may have a structure wherein the first inorganic layer and the second inorganic layer are sequentially stacked at an edge thereof.

In some embodiments, the encapsulation layer may have a structure wherein the first inorganic layer and the second inorganic layer are sequentially stacked at an edge thereof. In some embodiments, the second inorganic layer may have an upper surface, a lower surface, or an edge contacting the first inorganic layer.

In one embodiment, the first inorganic layer and the second inorganic layer may have the same area. In another embodiment, the second inorganic layer may be formed to surround the first organic layer. In other embodiments, the inorganic layers may have the same area or may have a gradually increasing area with increasing distance from the organic light emitting diode.

Next, an organic light emitting diode display apparatus according to one embodiment of the invention will be described with reference to FIG. 1. FIG. 1 is a partially sectional view of an organic light emitting diode display apparatus in accordance with one embodiment of the invention.

Referring to FIG. 1, an organic light emitting diode display apparatus 100 according to one embodiment includes a substrate 110, an organic light emitting diode 120, and an encapsulation layer 130, which can encapsulate the organic light emitting diode 120.

The substrate 110 may be disposed under the organic light emitting diode 120 and the encapsulation layer 130 to support the organic light emitting diode 120 and the encapsulation layer 130. The substrate 110 may include a luminous region in which the organic light emitting diode 120 is formed, and a non-luminous region corresponding to a region excluding the luminous region.

The substrate 110 may be a glass substrate, a quartz substrate or a transparent plastic substrate. The transparent plastic substrate may be applied to flexible products by providing flexibility to the organic light emitting diode display apparatus. The transparent plastic substrate may be formed of at least one among polyimide resins, acrylic resins, polyacrylate resins, polycarbonate resins, polyether resins, polyester resins including polyethylene terephthalate, and sulfonic acid resins, without being limited thereto.

The organic light emitting diode 120 may be formed on the luminous region of the substrate 110 to drive the organic light emitting diode display apparatus. The organic light emitting diode is a self-emissive device and may include a typical structure publicly known in the art.

Specifically, the organic light emitting diode may have a structure wherein an anode, a hole transport region, a light emitting layer, an electron transport region, and a cathode are sequentially stacked in this order. The hole transport region may include at least one of a hole injection layer, a hole transport layer and an electron blocking layer. The electron transport region may include at least one of a hole blocking layer, an electron transport layer and an electron injection layer. Light is emitted from the light emitting layer through recombination of holes generated from the anode and electrons generated from the cathode in the light emitting layer. Details of the anode, the hole transport region, the light emitting layer, the electron transport region, and the cathode are well known to those skilled in the art.

Specifically, the anode may be formed of a material having high work function to allow efficient injection of holes into the light emitting layer. Examples of materials for the anode may include metals such as nickel, platinum, vanadium, chromium, copper, zinc, and gold, metal alloys thereof, metal oxides such as zinc oxide, indium oxide, indium tin oxide, and indium zinc oxide, combinations of metals and metal oxides, such as a combination of zinc oxide and aluminum, a combination or zinc oxide and antimony. The cathode may be formed of a material having low work function to allow easy injection of electrons into an organic light emitting layer. Examples of materials for the cathode may include metals such as magnesium, calcium, sodium, potassium, titanium, indium, yttrium, lithium, gadolinium, aluminum, silver, tin, lead, cesium, barium, or metal alloys thereof.

The light emitting layer may include a material known to those skilled in the art. For example, the light emitting layer may include fluorine derivatives and metal complexes, without being limited thereto.

The hole transport region may be formed of materials such as m-MTDATA, TDATA, 2-TNATA, NPB, β-NPB, TPD, Spiro-TPD, Spiro-NPB, α-NPB, TAPC, HMTPD, PEDOTT/PSS (poly(3,4-ethylenedioxythiophene)/poly(4-styrenesulfonate), and PANI/PSS (polyaniline/poly(4-styrenesulfonate) as follows, without being limited thereto.

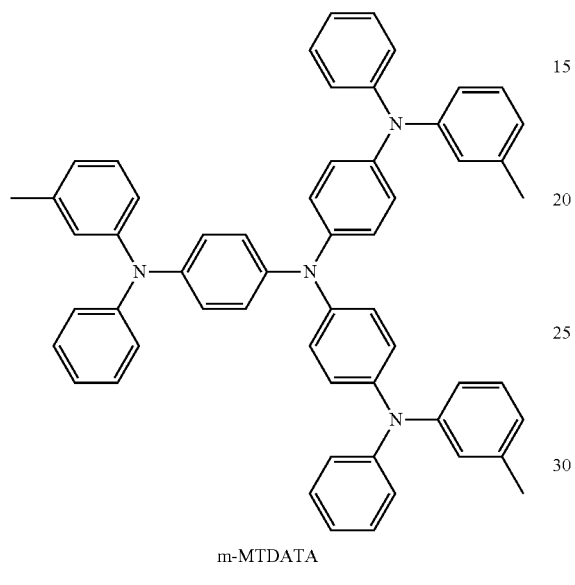

m-MTDATA

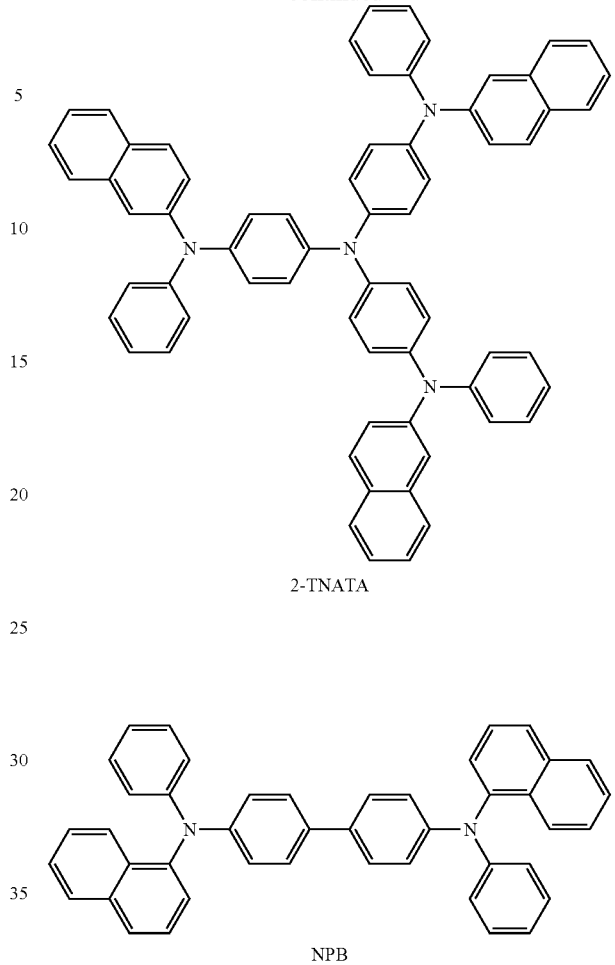

2-TNATA

NPB

β-NPB

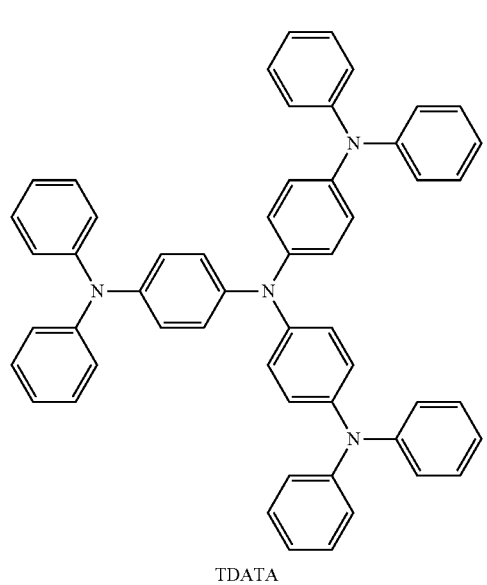

TDATA

TPD

BCP
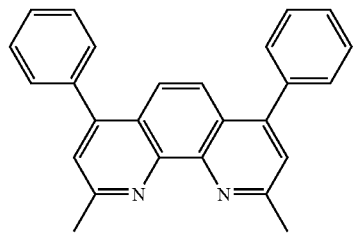
Bphen
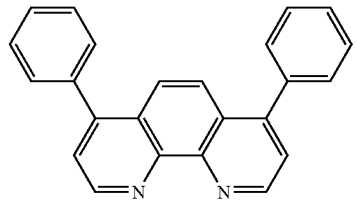
The electron transport layer may include at least one of BCP and Bphen as above, and Alq₃, BAlq, TAZ, NTAZ, ET1, and ET2 as follows, without being limited thereto.
Spiro-TPD
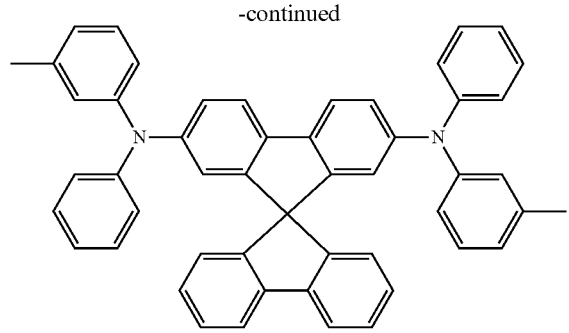
Spiro-NPB
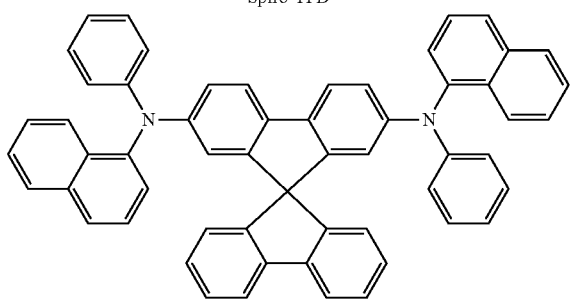
α-NPB
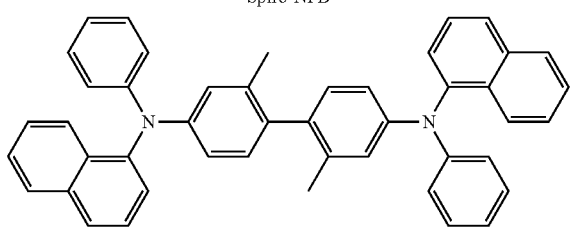
Alq₃
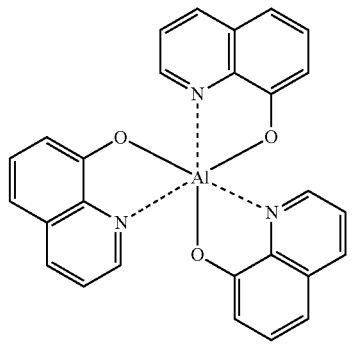
BAlq
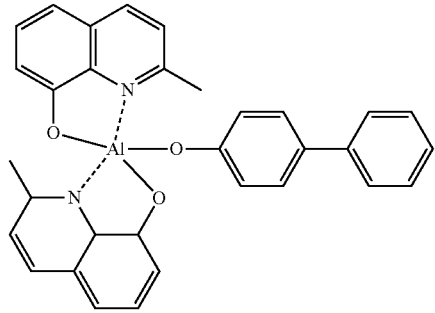
TAPC
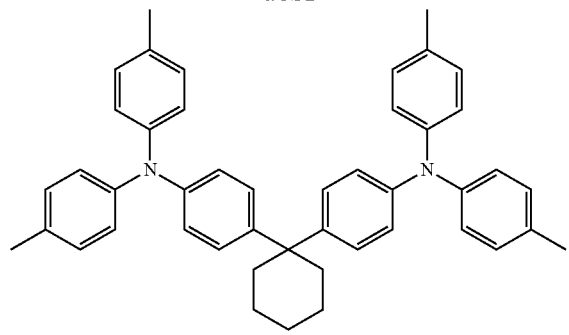
HMTPD
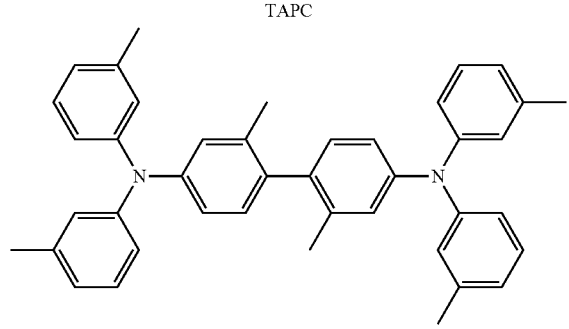
TAZ
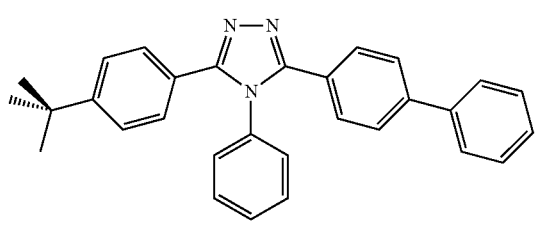
In the electron transport region, the hole blocking layer may include at least one of BCP and Bphen as follows, without being limited thereto.

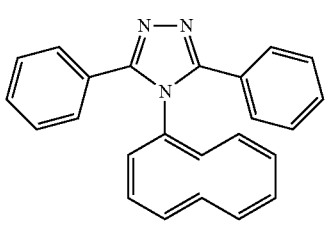
NTAZ

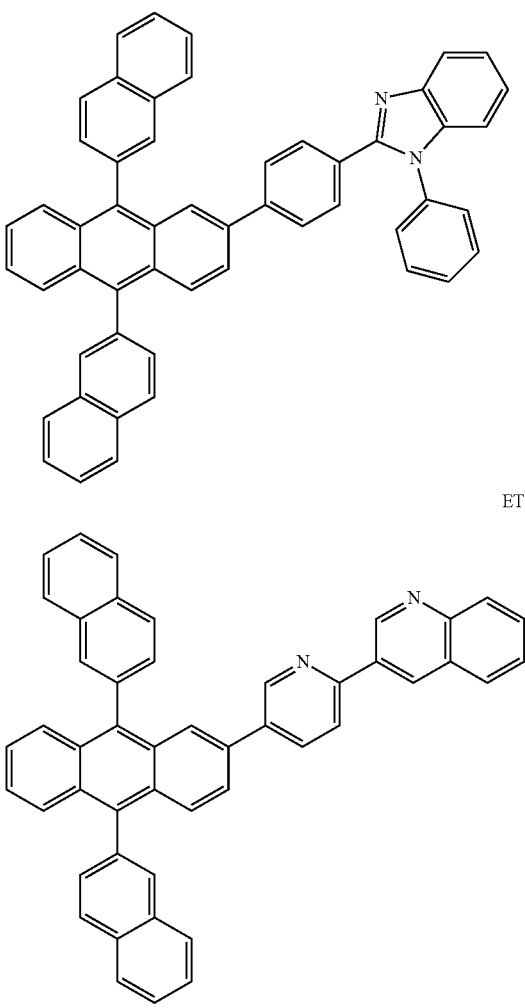

ET1

ET2

The electron injection layer may include at least one of LiF, NaCl, CsF, Li$_2$O, and BaO, without being limited thereto:

The encapsulation layer 130 may be directly formed on the organic light emitting diode 120 to encapsulate the organic light emitting diode 120. Herein, the expression "directly formed on" means that no adhesive layer, bonding layer and/or air layer is interposed between the encapsulation layer and the organic light emitting diode.

The encapsulation layer 130 may have a multilayer structure in which two or more inorganic layers and one or more organic layers are alternately stacked one above another. FIG. 1 shows an organic light emitting diode display apparatus including an encapsulation layer in which two inorganic layers and one organic layer are alternately stacked in a total of three layers. Specifically, FIG. 1 shows an organic light emitting diode display apparatus including an encapsulation layer in which a first inorganic layer 131, a first organic layer 132, and a second inorganic layer 133 are alternately stacked. In other embodiments, the encapsulation layer may have other types of multilayer structure in which the inorganic layers and the organic layers are alternately stacked in a total of 5 to 15 layers, specifically, 5 layers, 6 layers or 7 layers. For example, in the structure wherein the encapsulation layer includes a total of 5 layers, the encapsulation layer may include a first inorganic layer, a first organic layer, a second inorganic layer, a second organic layer, and a third inorganic layer alternately stacked one above another. In the structure wherein the encapsulation layer includes a total of 7 layers, the encapsulation layer may include a first inorganic layer, a first organic layer, a second inorganic layer, a second organic layer, a third inorganic layer, a third organic layer, and a fourth inorganic layer alternately staked one above another. Generally, the outermost layer of the encapsulation layer may be an inorganic layer. With this structure, the organic light emitting diode display apparatus can facilitate maintenance and processability.

Referring to FIG. 1, the structure of the encapsulation layer wherein the inorganic layers include the first inorganic layer 131 and the second inorganic layer 133, and the organic layer includes the first organic layer 132 will be described in more detail.

Each of the first inorganic layer 131 and the second inorganic layer 133 has a different composition than the first organic layer 132 and can compensate for effects of the first organic layer 131. Each of the first and second inorganic layers 131, 133 can suppress permeation of oxygen or moisture into the organic light emitting diode 120.

The first inorganic layer 131 is formed to directly contact the organic light emitting diode 120 and the substrate 110. With this structure, the first inorganic layer 131 can suppress permeation of external moisture and/or oxygen into the organic light emitting diode 120. As used herein, the expression "formed to directly contact" means that no adhesive layer, bonding layer and/or air layer is interposed between the organic light emitting diode 120 and the first inorganic layer 131.

The second inorganic layer 133 is directly formed on the first organic layer 132. The first organic layer 132 has high plasma resistance. Accordingly, the second inorganic layer 133 can secure a uniform thickness and the encapsulation layer 130 can secure uniform surface roughness.

The second inorganic layer 133 is formed to at least partially contact the first inorganic layer 131. Thus, the encapsulation layer 130 may have a structure wherein the first inorganic layer 131 and the second inorganic layer 133 are sequentially stacked on the substrate 110. With this structure, the encapsulation layer 130 can further suppress permeation of external moisture and/or oxygen into the organic light emitting diode 120 while further improving encapsulation functions at side surfaces of the organic light emitting diode 120. Furthermore, the encapsulation layer 130 can improve reliability of the organic light emitting diode 120 by preventing slight lifting and/or delamination between the first inorganic layer 131 and the second inorganic layer 133. Referring to FIG. 1, the encapsulation layer 130 has a structure wherein the first inorganic layer 131 and the second inorganic layer 133 are sequentially stacked at an edge thereof.

The second inorganic layer 133 has a lower surface contacting the first inorganic layer 131. With this structure, a contact area between the first inorganic layer 131 and the second inorganic layer 133 is enlarged, thereby further improving encapsulation effects. In some embodiments, the second inorganic layer 133 may be formed to contact the first inorganic layer 131 at an edge of the second inorganic layer 133, particularly, a thickness portion or an upper surface of the second inorganic layer 133.

The second inorganic layer 133 surrounds the first organic layer 132 and is sequentially stacked on the first inorganic layer 131. In this structure, the first inorganic layer 131 has the same area as the second inorganic layer 133. Alternatively, the second inorganic layer 133 may be formed to surround both the first organic layer 132 and the first inorganic layer 131. Alternatively, the inorganic layers may have a gradually increasing area with increasing distance from the organic light emitting diode 120. With this structure, the encapsulation layer 130 can suppress permeation of external moisture and/or oxygen into the organic light emitting diode 120 while further suppressing delamination and/or slight lifting between the first inorganic layer 131 and the second inorganic layer 132.

Each of the first inorganic layer 131 and the second inorganic layer 133 may be formed of an inorganic material having excellent light transmittance. The first inorganic layer 131 and the second inorganic layer 133 may be formed of the same or different inorganic materials. Specifically, the inorganic materials may include metals, nonmetals, intermetallic compounds or alloys, inter non-metallic compounds or alloys, oxides of metals or nonmetals, fluorides of metals or nonmetals, nitrides of metals or nonmetals, carbides of metals or nonmetals, oxynitrides of metals or nonmetals, borides of metals or nonmetals, oxyborides of metals or nonmetals, silicides of metals or nonmetals, and mixtures thereof. The metals or nonmetals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto. Specifically, the inorganic materials may include silicon oxide ($SiO_x$), silicon nitride ($SiN_x$), silicon oxynitride ($SiO_xN_y$), ZnSe, ZnO, $Sb_2O_3$, $AlO_x$ including $Al_2O_3$, $In_2O_3$, or $SnO_2$. Here, each of x and y ranges from 1 to 5.

The first and second inorganic layers 131, 133 may have the same or different thicknesses. Specifically, each of the first inorganic layer 131 and the second inorganic layer 133 may have a thickness of about 40 nm to about 1000 nm, more specifically about 100 nm to about 1000 nm. Within this thickness range, the first and second inorganic layers 131, 133 can block permeation of moisture and oxygen.

The first organic layer 132 may be disposed inside a region defined between the first inorganic layer 131 and the second inorganic layer 133. That is, the first organic layer 132 may be completely surrounded by the first inorganic layer 131 and the second inorganic layer 133. The first organic layer 132 may be formed of an encapsulating composition according to the present invention. Accordingly, the first organic layer 132 can realize an effect of blocking permeation of external moisture and oxygen by blocking defects of the inorganic layers while flattening the inorganic layers.

FIG. 1 shows the structure wherein the encapsulation layer 130 includes only the first organic layer 132 as an organic layer. In another embodiment, the encapsulation layer 130 may further include a second organic layer and a third inorganic layer sequentially formed on the second inorganic layer 133. In this embodiment, the first organic layer 132 and the second organic layer may have the same area. Alternatively, the second organic layer may have a larger area than the first organic layer. That is, the organic layers may have the same area or a gradually increasing area with increasing distance from the organic light emitting diode 120.

The first organic layer 132 may have a thickness of about 0.2 µm to about 15 µm, specifically about 1 µm, about 2 µm, about 3 µm, about 4 µm, about 5 µm, about 6 µm, about 7 µm, about 8 µm, about 9 µm, about 10 µm, about 11 µm, about 12 about 13 µm, about 14 µm, or about 15 µm. Within this thickness range, the first organic layer 132 can realize an effect of blocking permeation of external moisture and oxygen by blocking defects of the inorganic layer while flattening the inorganic layer.

The first organic layer 132 may be formed of an encapsulating composition according to embodiments of the present invention. Thus, the organic layer according to the embodiments of the invention can secure reliability of the organic light emitting diode display apparatus in elapsed time by protecting the organic light emitting diode display apparatus from surroundings including moisture and gas.

Next, an encapsulating composition according to embodiments of the present invention will be described.

An encapsulating composition according to one embodiment of the present invention includes: about 10 wt % to about 70 wt % of (A) a non-silicon-based di(meth)acrylate; about 20 wt % to about 70 wt % of (B) a silicon-based di(meth)acrylate; about 5 wt % to about 40 wt % of (C) a mono(meth)acrylate; and about 1 wt % to about 10 wt % of (D) an initiator, wherein the (B) silicon-based di(meth)acrylate may be represented by Formula 1:

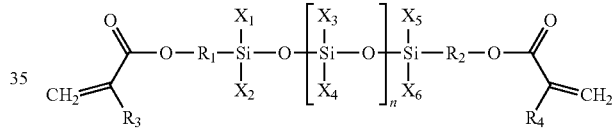

(wherein $R_1$, $R_2$, $R_3$, $R_4$, $X_1$, $X_2$, $X_3$, $X_4$, $X_5$, $X_6$, and n will be described in detail below).

The encapsulating composition according to the embodiment of the invention may include the (A) non-silicon-based di(meth)acrylate, the (B) silicon-based di(meth)acrylate represented by Formula 1, the (C) mono(meth)acrylate, and the (D) initiator. In addition, the encapsulating composition according to the embodiments may include the (A) non-silicon-based di(meth)acrylate, the (B) silicon-based di(meth)acrylate represented by Formula 1, the (C) mono(meth)acrylate, and the (D) initiator in the specific amounts as set forth above. Thus, the encapsulating composition can exhibit significantly improved photocuring rate. Further, the encapsulating composition can realize an organic layer exhibiting excellent light transmittance after curing while exhibiting significantly high plasma resistance. Thus, the encapsulating composition according to the embodiment can realize an organic layer having low etching rate due to plasma used in formation of an inorganic layer and thus can improve reliability of an organic light emitting diode.

Specifically, the encapsulating composition according to the embodiment may have a photocuring rate of about 88% or more, specifically about 88% to about 99%, more specifically about 90% to about 99%, for example, about 90%, about 91%, about 92%, about 93%, about 94%, about 95%, about 96%, about 97%, about 99%, or about 99%. In addition, the encapsulating composition according to the embodiment may have a light transmittance of about 93% after curing, for example, about 93.5% to about 100%, about 94.2% to about 100%, about 95% to about 99%, or about 96% to about 99%, at a wavelength of about 380 nm to about 700 nm. Further, the encapsulating composition according to the embodiment may have an etching rate of an organic layer due to plasma of about 20% or less after curing, for example, about 0.1%, about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, or about 20%. Within these ranges of photocuring rate, light transmittance and etching rate of the organic layer due to plasma, the encapsulating composition according to the embodiment can significantly improve reliability of the organic light emitting diode.

In one embodiment, the encapsulating composition may include about 10 wt % to about 50 wt % of the (A) non-silicon-based di(meth)acrylate, about 20 wt % to about 70 wt % of the (B) silicon-based di(meth)acrylate, about 5 wt % to about 40 wt % of the (C) mono(meth)acrylate, and about 1 wt % to about 10 wt % of the (D) initiator, based on the total weight of (A), (B), (C) and (D).

As used herein, the (A) non-silicon-based di(meth)acrylate, the (B) silicon-based di(meth)acrylate, the (C) mono (meth)acrylate and the (D) initiator are different compounds.

Hereinafter, the (A) non-silicon-based di(meth)acrylate, the (B) silicon-based di(meth)acrylate, the (C) mono(meth)acrylate and the (D) initiator will be described in more detail.

(A) Non-Silicon-Based Di(Meth)Acrylate

The (A) non-silicon-based di(meth)acrylate is a photocurable monomer which does not include silicon (Si) and has two (meth)acrylate groups. Thus, the encapsulating composition can have improved photocuring rate and improved post-curing light transmittance. In addition, the (A) non-silicon-based di(meth)acrylate has low viscosity at 25° C. and thus can reduce viscosity of the encapsulating composition. Thus, the encapsulating composition can facilitate formation of an organic layer on an organic light emitting diode or on an inorganic layer encapsulating the organic light emitting diode using a method such as inkjet printing and the like.

The (A) non-silicon-based di(meth)acrylate is a non-aromatic non-silicon-based di(meth)acrylate not containing an aromatic group, and may include a substituted or unsubstituted long-chain alkylene group-containing non-silicon-based di(meth)acrylate. In this case, the encapsulating composition facilitates formation of the organic layer on the organic light emitting diode or on the inorganic layer encapsulating the organic light emitting diode using a method such as deposition and the like.

Specifically, the (A) non-silicon-based di(meth)acrylate may be a substituted or unsubstituted $C_1$ to $C_{20}$ alkylene group-containing di(meth)acrylate. More specifically, the (A) non-silicon-based di(meth)acrylate may include a di(meth)acrylate having an unsubstituted $C_1$ to $C_{15}$ alkylene group between (meth)acrylate groups. Here, the number of carbon atoms in the alkylene group refers to the number of carbon atoms present only in the alkylene group excluding carbon atoms present in the di(meth)acrylate group.

In one embodiment, the (A) non-silicon-based di(meth)acrylate may be represented by Formula 2:

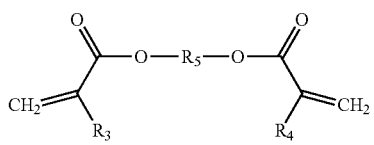

wherein $R_3$ and $R_4$ are each independently hydrogen or a methyl group, and $R_5$ is a substituted or unsubstituted $C_1$ to $C_{20}$ alkylene group.

Since the encapsulating composition according to the present invention includes the (A) non-silicon-based di(meth)acrylate represented by Formula 2, the encapsulating composition can exhibit higher photocuring rate and allows more easy deposition due to low viscosity thereof.

For example, $R_5$ in Formula 2 may be an unsubstituted $C_8$ to $C_{12}$ alkylene group. More specifically, the (A) non-silicon-based di(meth)acrylate may include at least one of octanediol di(meth)acrylate, nonanediol di(meth)acrylate, decanediol di(meth)acrylate, undecanediol di(meth)acrylate, and dodecanediol di(meth)acrylate.

The (A) non-silicon-based di(meth)acrylates may be used alone or in combination thereof in the encapsulating composition.

The (A) non-silicon-based di(meth)acrylate may be present in an amount of about 10 wt % to about 70 wt % based on the total weight of (A), (B), (C) and (D). For example, the (A) non-silicon-based di(meth)acrylate may be present in an amount of about 10 wt % to about 50 wt %, for example, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, or about 48 wt %, based on the total weight of (A), (B), (C) and (D). Within this range, the encapsulating composition can exhibit improved photocuring rate, and can realize an organic layer exhibiting high light transmittance and low plasma etching rate.

(B) Silicon-Based Di(Meth)Acrylate

The (B) silicon-based di(meth)acrylate includes at least one substituted or unsubstituted $C_6$ to $C_{30}$ aryl group, which is connected to a silicon atom. Thus, the encapsulating composition can realize an organic layer having very high plasma resistance, thereby exhibiting low plasma etching rate.

The (B) silicon-based di(meth)acrylate may be represented by Formula 1:

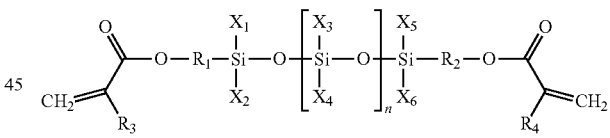

wherein $R_1$ and $R_2$ are each independently a single bond, a substituted or unsubstituted $C_1$ to $C_{20}$ alkylene group, a substituted or unsubstituted $C_1$ to $C_{30}$ alkylene ether group, *—N(R')—(R")—* (* representing a binding site for an element, R' being hydrogen or a substituted or unsubstituted $C_1$ to $C_{30}$ alkyl group, and R" being a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—(R')—O—** (* representing a binding site for O in Formula 1, ** representing a binding site for Si in Formula 1, and R' being a substituted or unsubstituted $C_1$ to $C_{30}$ alkylene group);

$X_1$, $X_2$, $X_3$, $X_4$, $X_5$ and $X_6$ are each independently hydrogen, a hydroxyl group, a halogen, a cyano group, a substituted or unsubstituted $C_1$ to $C_{30}$ alkyl group, a substituted or unsubstituted $C_1$ to $C_{30}$ heterocycloalkyl group, a substituted or unsubstituted $C_3$ to $C_{30}$ cycloalkyl group, a substituted or unsubstituted $C_1$ to $C_{30}$ alkyl ether group, *—N(R')—(R")—* (* representing a binding site for an element, and R' and R″ being each independently hydrogen or a substituted or unsubstituted $C_1$ to $C_{30}$ alkyl group), a substituted or unsubstituted $C_1$ to $C_{30}$ alkyl sulfide group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group;

at least one of $X_1$, $X_2$, $X_3$, $X_4$, $X_5$ and $X_6$ is a substituted or unsubstituted $C_6$ to $C_{30}$ aryl group, or a substituted or unsubstituted $C_2$ to $C_{30}$ heteroaryl group;

$R_3$ and $R_4$ are each independently hydrogen or a methyl group; and n is an integer from 0 to 30, or ranges from 0 to 30 on average.

The term "single bond" means that Si and O are directly connected (Si—O) in Formula 1.

Specifically, in Formula 1, $R_1$ and $R_2$ may be each independently a single bond, a substituted or unsubstituted $C_1$ to $C_{20}$ alkylene group, or a substituted or unsubstituted $C_1$ to $C_{30}$ alkylene ether group. Specifically, $X_1$, $X_2$, $X_3$, $X_4$, $X_5$ and $X_6$ may be each independently hydrogen, a substituted or unsubstituted $C_1$ to $C_{30}$ alkyl group, a substituted or unsubstituted $C_3$ to $C_{30}$ cycloalkyl group, a substituted or unsubstituted $C_1$ to $C_{30}$ alkyl ether group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group; and at least one of $X_1$, $X_2$, $X_3$, $X_4$, $X_5$ and $X_6$ may be a substituted or unsubstituted $C_6$ to $C_{30}$ aryl group.

More specifically, in Formula 1, $R_1$ and $R_2$ may be each independently a single bond, or a substituted or unsubstituted $C_1$ to $C_{20}$ alkylene group. In this case, the encapsulating composition can further reduce the plasma etching rate.

More specifically, in Formula 1, $X_1$, $X_2$, $X_3$, $X_4$, $X_5$ and $X_6$ may be each independently a substituted or unsubstituted $C_1$ to $C_{10}$ alkyl group, or a substituted or unsubstituted $C_6$ to $C_{10}$ aryl group; and at least one of $X_1$, $X_2$, $X_3$, $X_4$, $X_5$ and $X_6$ may be a substituted or unsubstituted $C_6$ to $C_{10}$ aryl group. More specifically, $X_1$, $X_2$, $X_3$, $X_4$, $X_5$ and $X_6$ may be each independently a methyl, ethyl, propyl, butyl, pentyl, phenyl, biphenyl, or naphthyl group; and one, two, three or six of $X_1$, $X_2$, $X_3$, $X_4$, $X_5$ and $X_6$ may be a phenyl or naphthyl group. In this case, the encapsulating composition can further reduce the plasma etching rate.

More specifically, n is an integer from about 1 to about 5. In this case, the encapsulating composition can further reduce the plasma etching rate.

More specifically, the (B) silicon-based di(meth)acrylate may be represented by any one of Formulae 3 to 8.

<Formula 3>

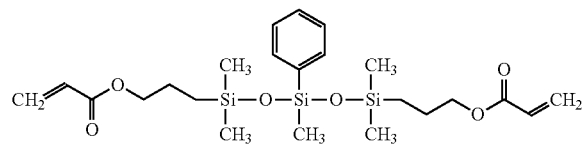

<Formula 4>

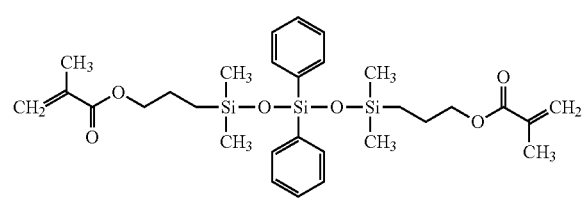

<Formula 5>

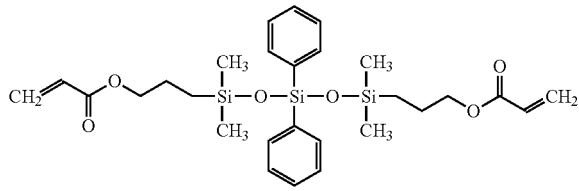

<Formula 6>

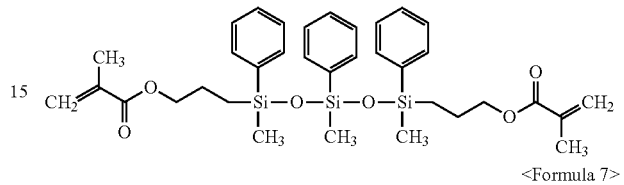

<Formula 7>

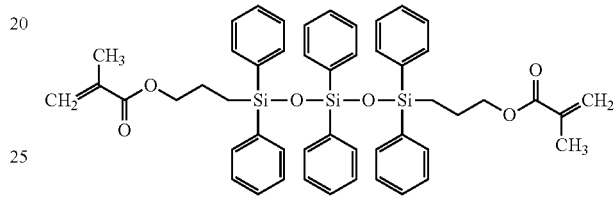

<Formula 8>

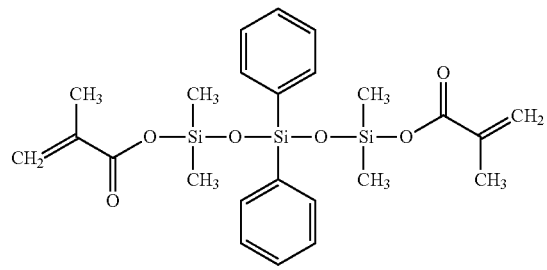

The (B) silicon-based di(meth)acrylates may be used alone or in combination thereof.

The (B) silicon-based di(meth)acrylate may be present in an amount of about 20 wt % to about 70 wt % based on the total weight of (A), (B), (C) and (D). For example, the (B) silicon-based di(meth)acrylate may be present in an amount of about 25 wt % to about 45 wt %, for example, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, or about 41 wt %, based on the total weight of (A), (B), (C) and (D). Within this range, the encapsulating composition can exhibit high photocuring rate. In addition, the encapsulating composition can realize an organic layer exhibiting high light transmittance and low plasma etching rate.

The (A) non-silicon-based di(meth)acrylate and the (B) silicon-based di(meth)acrylate represented by Formula 1 may be present in a total amount of about 50 wt % to about 90 wt %, specifically about 60 wt % to about 90 wt % based on the total weight of (A), (B), (C) and (D). Within this range, the encapsulating composition can realize an organic layer exhibiting low plasma etching rate.

The (A) non-silicon-based di(meth)acrylate and the (B) silicon-based di(meth)acrylate represented by Formula 1 may be present in a weight ratio (A:B) of, for example, about 1:0.1 to about 1:1, about 1:0.1 to about 1:85, about 1:0.1 to about 1:80, about 1:0.1 to about 1.75, about 1:0.1 to about 1:70, about 1:0.1 to about 1:0.65, or about 1:0.1 to about 1:0.6. Within this range, the encapsulating composition can realize an organic layer exhibiting further reduced plasma etching rate.

The (B) silicon-based di(meth)acrylate may be prepared by a typical method. For example, the (B) silicon-based di(meth)acrylate may be prepared by reacting a siloxane compound, in which a substituted or unsubstituted $C_6$ to $C_{30}$ aryl group or a substituted or unsubstituted $C_2$ to $C_{30}$ heteroaryl group is connected to at least one silicon atom, with a compound extending a carbon chain (for example, allyl alcohol), followed by reaction with (meth)acryloyl chloride, without being limited thereto. Alternatively, the (B) silicon-based di(meth)acrylate may be prepared by reacting a siloxane compound, in which a substituted or unsubstituted $C_6$ to $C_{30}$ aryl group or a substituted or unsubstituted $C_2$ to $C_{30}$ heteroaryl group is connected to at least one silicon atom, with (meth)acryloyl chloride, without being limited thereto.

(C) Mono(Meth)Acrylate

The (C) mono(meth)acrylate included in the encapsulating composition can increase a photocuring rate of the encapsulating composition. In addition, the (C) mono(meth)acrylate can reduce a plasma etching rate of the organic layer while increasing light transmittance of the organic layer.

The (C) mono(meth)acrylate may include a non-silicon-based mono(meth)acrylate not containing silicon. Specifically, the (C) mono(meth)acrylate may include at least one of aromatic mono(meth)acrylates containing an aromatic group and non-aromatic mono(meth)acrylates not containing an aromatic group.

The (C) mono(meth)acrylates may be used alone or in combination thereof. The aromatic mono(meth)acrylates among the (C) mono(meth)acrylates may be used alone or in combination thereof. The non-aromatic mono(meth)acrylates among the (C) mono(meth)acrylates may be used alone or in combination thereof.

In one embodiment, the (C) mono(meth)acrylate may include an aromatic group-containing mono(meth)acrylate. Since both the aromatic group-containing mono(meth)acrylate and the (B) silicon-based di(meth)acrylate as set forth above contain an aromatic group, the aromatic group-containing mono(meth)acrylate and the (B) silicon-based di(meth)acrylate exhibit further improved compatibility in the encapsulating composition when used together. Thus, the (C) mono(meth)acrylate can exhibit further improved miscibility with the (B) silicon-based di(meth)acrylate. In this case, the encapsulating composition can have an improved effect of reducing a plasma etching rate of the organic layer.

The aromatic mono(meth)acrylate may include a substituted or unsubstituted aromatic group-containing mono(meth)acrylate. Here, the term "aromatic group" refers to a monocyclic aromatic group or a polycyclic aromatic group including fused forms and the like, or refers to a form in which single rings are connected to each other by a sigma bond. For example, the aromatic group may refer to at least one of a substituted or unsubstituted $C_6$ to $C_{50}$ aryl group, a substituted or unsubstituted $C_7$ to $C_{50}$ arylalkyl group, a substituted or unsubstituted $C_3$ to $C_{50}$ heteroaryl group, and a substituted or unsubstituted $C_3$ to $C_{50}$ heteroarylalkyl group. More specifically, the aromatic group may include at least one of phenyl, biphenyl, terphenyl, quaterphenyl, naphthyl, anthracenyl, phenanthrenyl, chrysenyl, triphenylenyl, tetracenyl, pyrenyl, benzopyrenyl, pentacenyl, coronenyl, ovalenyl, corannulenyl, benzyl, pyridinyl, pyrazinyl, pyrimidinyl, pyridazinyl, triazinyl, quinolinyl, isoquinolinyl, quinoxalinyl, acridinyl, quinazolinyl, cinnolinyl, phthalazinyl, thiazolyl, benzothiazolyl, isoxazolyl, benzisoxazolyl, oxazolyl, benzoxazolyl, pyrazolyl, indazolyl, imidazolyl, benzimidazolyl, purinyl, thiophenyl, benzothiophenyl, furanyl, benzofuranyl, and isobenzofuranyl groups.

For example, the aromatic mono(meth)acrylate may be represented by Formula 9:

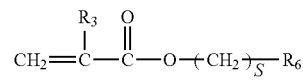

wherein $R_3$ is hydrogen or a methyl group; s is an integer from 0 to 10; and $R_6$ is a substituted or unsubstituted $C_6$ to $C_{50}$ aryl group or a substituted or unsubstituted $C_6$ to $C_{50}$ aryloxy group.

For example, $R_6$ may be a phenylphenoxyethyl group, a phenoxyethyl group, a benzyl group, a phenyl group, a phenylphenoxy group, a phenoxy group, a phenylethyl group, a phenylpropyl group, a phenylbutyl group, a methylphenylethyl group, a propylphenylethyl group, a methoxyphenylethyl group, a cyclohexylphenylethyl group, a chlorophenylethyl group, a bromophenylethyl group, a methylphenyl group, a methylethylphenyl group, a methoxyphenyl group, a propylphenyl group, a cyclohexylphenyl group, a chlorophenyl group, a bromophenyl group, a phenylphenyl group, a biphenyl group, a terphenyl group, a quaterphenyl group, an anthracenyl group, a naphthalenyl group, a triphenylenyl group, a methylphenoxy group, an ethylphenoxy group, a methylethylphenoxy group, a methoxyphenyloxy group, a propylphenoxy group, a cyclohexylphenoxy group, a chlorophenoxy group, a bromophenoxy group, a biphenyloxy group, a terphenyloxy group, a quaterphenyloxy group, an anthracenyloxy group, a naphthalenyloxy group, or a triphenylenyloxy group.

Specifically, the aromatic mono(meth)acrylate may include at least one of 2-phenylphenoxyethyl (meth)acrylate, phenoxyethyl (meth)acrylate, phenyl (meth)acrylate, phenoxy (meth)acrylate, 2-ethylphenoxy (meth)acrylate, benzyl (meth)acrylate, 2-phenylethyl (meth)acrylate, 3-phenylpropyl (meth)acrylate, 4-phenylbutyl (meth)acrylate, 2-(2-methylphenyl)ethyl (meth)acrylate, 2-(3-methylphenyl)ethyl (meth)acrylate, 2-(4-methylphenyl)ethyl (meth)acrylate, 2-(4-propylphenyl)ethyl (meth)acrylate, 2-(4-(1-methylethyl)phenyl)ethyl (meth)acrylate, 2-(4-methoxyphenyl)ethyl (meth)acrylate, 2-(4-cyclohexylphenyl)ethyl (meth)acrylate, 2-(2-chlorophenyl)ethyl (meth)acrylate, 2-(3-chlorophenyl)ethyl (meth)acrylate, 2-(4-chlorophenyl)ethyl (meth)acrylate, 2-(4-bromophenyl)ethyl (meth)acrylate, 2-(3-phenylphenyl)ethyl (meth)acrylate, 4-(biphenyl-2-yloxy)butyl (meth)acrylate, 3-(biphenyl-2-yloxy)butyl (meth)acrylate, 2-(biphenyl-2-yloxy)butyl (meth)acrylate, 1-(biphenyl-2-yloxy)butyl (meth)acrylate, 4-(biphenyl-2-yloxy)propyl (meth)acrylate, 3-(biphenyl-2-yloxy)propyl (meth)acrylate, 2-(biphenyl-2-yloxy)propyl (meth)acrylate, 1-(biphenyl-2-yloxy)propyl (meth)acrylate, 4-(biphenyl-2-yloxy)ethyl (meth)acrylate, 3-(biphenyl-2-yloxy)ethyl (meth)acrylate, 2-(biphenyl-2-yloxy)ethyl (meth)acrylate, 1-(biphenyl-2-yloxy)ethyl (meth)acrylate, 2-(4-benzylphenyl)ethyl (meth)acrylate, 1-(4-benzylphenyl)ethyl (meth)acrylate, and structural isomers thereof, without being limited thereto. In addition, it should be understood that the (meth)acrylates as set forth herein are provided only by way of example and the present invention is not limited thereto. Further, the (meth)acrylates according to the present invention include all acrylates corresponding to structural isomers. For example, although only 2-phenylethyl (meth)acrylate is mentioned by way of example, the (meth)acrylates according to the present invention include all of 3-phenylethyl (meth)acrylate and 4-phenyl (meth)acrylate.

The non-aromatic mono(meth)acrylate may be a substituted or unsubstituted $C_1$ to $C_{20}$ alkyl group-containing mono(meth)acrylate. Specifically, the non-aromatic mono (meth)acrylate may be an unsubstituted linear $C_1$ to $C_{20}$ alkyl group-containing mono(meth)acrylate, more specifically an unsubstituted linear $C_{10}$ to $C_{20}$ alkyl group-containing mono(meth)acrylate. For example, the non-aromatic mono(meth)acrylate may include at least one of decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and arachidyl (meth)acrylate, without being limited thereto.

The (C) mono(meth)acrylate may be present in an amount of about 5 wt % to about 40 wt % based on the total weight of (A), (B), (C) and (D). For example, the (C) mono(meth) acrylate may be present in an amount of about 5 wt % to about 30 wt % based on the total weight of (A), (B), (C) and (D). Within this range, the encapsulating composition can exhibit high photocuring rate. In addition, the encapsulating composition can realize an organic layer exhibiting high light transmittance and low plasma etching rate.

(D) Initiator

The (D) initiator allows the organic layer to be formed by curing the (A) non-silicon-based di(meth)acrylate, the (B) silicon-based di(meth)acrylate and the (C) mono(meth)acrylate, and may include any typical photopolymerization initiators without limitation.

The (D) initiator may include at least one of triazine, acetophenone, benzophenone, thioxanthone, benzoin, phosphorus, and oxime initiators, without being limited thereto. For example, the phosphorus initiator may include diphenyl (2,4,6-trimethylbenzoyl)phosphine oxide, benzyl(diphenyl) phosphine oxide, bis(2,6-dimethoxybenzoyl)(2,4,4-trimethylpentyl)phosphine oxide, and mixtures thereof. For example, the phosphorus initiator can exhibit better initiation performance under UV light of long wavelengths in the composition according to the present invention.

In the encapsulating composition, the (D) initiators may be used alone or in combination thereof.

The (D) initiator may be present in an amount of about 1 wt % to about 10 wt % based on the total weight of (A), (B), (C) and (D). Within this range, the encapsulating composition allows sufficient photopolymerization under exposure to light. In addition, the unreacted initiator remaining after photopolymerization can be reduced, whereby the organic layer can exhibit further improved light transmittance. Specifically, the (D) initiator may be present in an amount of about 2 wt %, about 3 wt %, about 4 wt %, or about 5 wt %, based on the total weight of (A), (B), (C) and (D).

The encapsulating composition may be formed by mixing the (A) non-silicon-based di(meth)acrylate, the (B) silicon-based di(meth)acrylate, the (C) mono(meth)acrylate and the (D) initiator. For example, the encapsulating composition may be formed as a solvent-free composition not containing a solvent. For example, when the composition for encapsulation of an organic light emitting diode is a solvent-free composition, wt % is based on the total weight of the (A) non-silicon-based di(meth)acrylate, the (B) silicon-based di(meth)acrylate, the (C) mono(meth)acrylate and the (D) initiator.

The encapsulating composition may include about 10 wt % to about 50 wt % of Si. Within this range, the composition can further reduce the plasma etching rate of the organic layer.

The encapsulating composition may have a viscosity at 25° C.±2° C. (23° C. to 27° C.) of about 0 cPs to about 200 cPs, specifically about 100 cPs or less, more specifically about 5 cPs to about 50 cPs, about 5 cPs to about 40 cPs, or about 5 cPs to about 30 cPs. Within this range, the encapsulating composition can facilitate formation of the organic layer. Within this range, it is advantageous to perform a method such as deposition and inkjet printing upon formation of the organic layer.

The encapsulating composition is a photocurable composition, and may be cured by UV irradiation at about 100 mW/cm$^2$ to about 500 mW/cm$^2$ for about 1 second to about 100 seconds, without being limited thereto The encapsulating composition may further include a heat stabilizer.

Hereinafter, an encapsulating composition according to another embodiment of the present invention will be described.

According to another embodiment of the present invention, the encapsulating composition may include (A) a non-silicon-based di(meth)acrylate, (B) a silicon-based di(meth)acrylate, (C) a mono(meth)acrylate, (D) an initiator and (E) a heat stabilizer, wherein the (B) silicon-based di(meth)acrylate may be represented by Formula 1, and wherein the encapsulating composition may include: about 10 wt % to about 70 wt % of the (A) non-silicon-based di(meth)acrylate; about 20 wt % to about 70 wt % of the (B) silicon-based di(meth)acrylate; about 5 wt % to about 40 wt % of the (C) mono(meth)acrylate; and about 1 wt % to about 10 wt % of the (D) initiator, based on the total weight of (A), (B), (C) and (D).

The encapsulating composition according to this embodiment can suppress change in viscosity at room temperature. The encapsulating composition according to this embodiment can exhibit higher light transmittance, higher photocuring rate and lower plasma etching rate than compositions for encapsulation materials which do not include the heat stabilizer. The components of the encapsulating composition according to this embodiment are the same as those of the composition according to the above embodiment excluding the heat stabilizer. Therefore, only the heat stabilizer will be described in detail hereinafter.

The (E) heat stabilizer is included in the composition for encapsulation to suppress change in viscosity at room temperature, and may include any typical heat stabilizers. In some embodiments, the (E) heat stabilizer may be a sterically hindered phenolic heat stabilizer.

Specifically, the (E) heat stabilizer may include at least one of pentaerythritol-tetrakis[3-(3,5-di-tert-butyl-4-hydroxyphenyl)propionate], stearyl-3-(3,5-di-t-butyl-4-hydroxyphenyl)propionate, 1,3,5-tris(2,6-dimethyl-3-hydroxy-4-t-butylbenzyl)isocyanurate, 1,3,5-tris(3,5-di-t-butyl-4-hydroxybenzyl)isocyanurate, 1,3,5-tris(2-hydroxyethyl)isocyanurate, pentaerythritol-tetrakis[3-(3,5-di-t-butylhydroxyphenyl)propionate], and tris(4-t-butyl-3-hydroxy-2,6-dimethylbenzyl)isocyanurate, without being limited thereto.

The (E) heat stabilizer may be present in an amount of about 2,000 ppm or less, specifically about 0.01 ppm to about 2,000 ppm, more specifically about 100 ppm to about 800 ppm, or about 100 ppm to about 750 ppm, based on the total weight of (A), (B), (C) and (D). Within this range, the heat stabilizer can further improve storage stability and processability of the encapsulating composition in a liquid state.

In one embodiment, the encapsulating composition may include the (A) non-silicon-based di(meth)acrylate, which includes a $C_1$ to $C_{20}$ alkylene group-containing di(meth)acrylate, the (B) silicon-based di(meth)acrylate represented by one of Formula 3 to Formula 8, the (C) mono(meth)acrylate represented by Formula 9, the (D) initiator including a phosphorus initiator, and the (E) heat stabilizer.

The encapsulating composition according to the embodiments of the invention has a total light transmittance of about 90% to about 100%, specifically about 93% to about 100%, for example, about 93.5%, about 94%, about 95%, about 96%, about 97%, about 98%, or about 99%, thereby providing a transparent organic protective layer. The total light transmittance may be measured at a wavelength of 400 nm to 700 nm using a haze meter NDH-5000 (Nippon Denshoku Co., Ltd.) in accordance with ASTM D1003-95 5.

The encapsulating composition according to the embodiments of the invention is deposited on a luminous front side and required to be transparent instead of exhibiting a color. When an encapsulation material exhibits a color, light emitted from a light source of a display and transmitted through the encapsulation material deposited on the luminous front side provides deviated color coordinates, thereby causing distortion of colors. Moreover, lower transparency provides further deteriorated efficiency of light emitted through the front side, thereby causing the display to appear unclear.

Although not shown in FIG. 1, the organic light emitting diode display apparatus 100 may include a drive circuit for driving the organic light emitting diode 120. In some embodiments, although not shown in FIG. 1, the organic light emitting diode display apparatus may further include a thin film transistor (TFT) layer and a buffer layer between the substrate 110 and the organic light emitting diode 120. The TFT layer drives the organic light emitting diode and may include a gate line, a data line, a drive power line, a reference power line, and a capacitor.

In some embodiments, although not shown in FIG. 1, the organic light emitting diode display apparatus may further include a bonding layer covering the encapsulation layer and a substrate bonded to the bonding layer to encapsulate the organic light emitting diode. The bonding layer may be a transparent bonding film. The bonding layer and the substrate may be formed of a typical material known to those skilled in the art.

Next, an organic light emitting diode display apparatus according to another embodiment of the present invention will be described with reference to FIG. 2.

Figure 2:
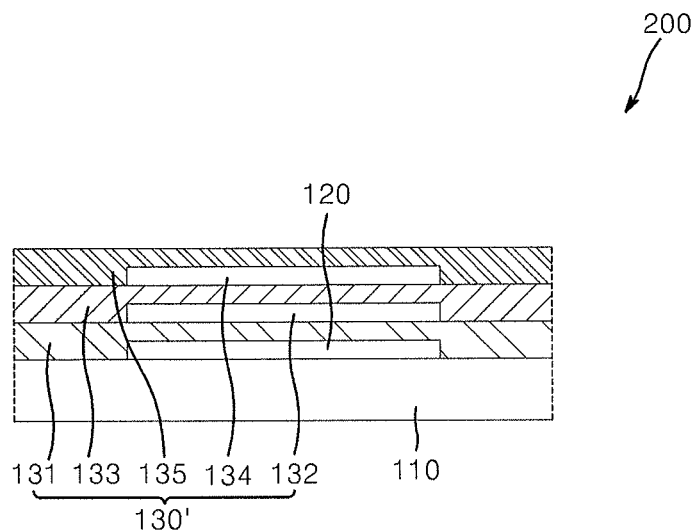
FIG. 2 is a sectional view of an organic light emitting diode display apparatus in accordance with another embodiment of the present invention.

Referring to FIG. 2, an organic light emitting diode display apparatus 200 according to this embodiment includes a substrate 110, an organic light emitting diode 120, and an encapsulation layer 130', which encapsulates the organic light emitting diode 120.

In the organic light emitting diode display apparatus 200 according to this embodiment, the encapsulation layer 130' includes a first inorganic layer 131, a first organic layer 132, a second inorganic layer 133, a second organic layer 134, and a third inorganic layer 135. In this embodiment, the second inorganic layer 133 is formed to contact at least a portion of the third inorganic layer 135, and the second organic layer 134 is disposed within a region between the second inorganic layer 133 and the third inorganic layer 135.

Next, a method of fabricating an organic light emitting diode display apparatus according to one embodiment of the present invention will be described.

The method of fabricating an organic light emitting diode display apparatus according to one embodiment of the invention may include forming an organic light emitting diode on a substrate, and forming an encapsulation layer in which inorganic layers and organic layers are alternately formed on the organic light emitting diode, wherein the organic layers may be formed of the encapsulating composition according to the embodiments of the present invention.

First, an organic light emitting diode is formed on a substrate. Specifically, a cathode is formed on the substrate; and a light emitting layer and other layers are formed thereon by dry coating, such as vacuum deposition, sputtering, plasma plating and ion plating, or wet coating, such as spin coating, dipping and flow coating, followed by formation of an anode thereon, thereby forming an organic light emitting diode on the substrate.

The inorganic layers may be formed by any suitable vacuum process including sputtering, evaporation, sublimation, CVD, PECVD, ECR-PECVD (electron cyclotron resonance plasma enhanced chemical vapor deposition), and combinations thereof, without being limited thereto. The organic layers may be formed by any method such as deposition, spin coating, printing, inkjet printing, and spraying, without being limited thereto.

Next, the present invention will be described in more detail with reference to some examples. It should be understood that these examples are provided for illustration only and are not to be construed in any way as limiting the present invention.

Preparative Example 1

In a 1000 ml flask provided with a cooling tube and a stirrer, 300 ml of ethyl acetate, 25 g of 3-phenyl-1,1,3,5,5-pentamethyltrisiloxane (Gelest Inc.) and 43 g of allyl alcohol (Daejung Chemicals & Materials Co., Ltd.) were placed, followed by nitrogen purging for 30 minutes. Next, 72 ppm of Pt-on-carbon black powder (Aldrich GmbH) was added to the mixture, followed by heating the flask to 80° C. and stirring the mixture for 4 hours. The remaining solvent was removed by distillation, thereby obtaining a compound. 71.5 g of the obtained compound and 39 g of triethylamine were sequentially added to 300 ml of dichloromethane, followed by slowly adding 34.3 g of acryloyl chloride while stirring the mixture at 0° C. The remaining solvent was removed by distillation, thereby obtaining a monomer (molecular weight: 522.85 g/mol) represented by Formula 3 and having a purity of 97% as determined by HPLC. (1H NMR: δ7.61, m, 3H; δ7.12, m, 2H; δ6.25, d, 2H; δ6.02, dd, 2H; δ5.82, t, 1H; δ5.59, d, 2H; δ3.87, m, 4H; δ1.54, m, 4H; δ0.58, m, 4H; δ0.02, m, 15H)

<Formula 3>

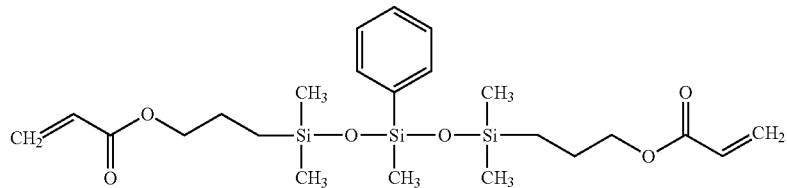

Preparative Example 2

A monomer (molecular weight: 584.92 g/mol) represented by Formula 4 was prepared in the same manner as in Preparative Example 1 except that 21 g of 3,3-diphenyl-1,1,5,5-tetramethyltrisiloxane was used instead of 25 g of 3-phenyl-1,1,3,5,5-pentamethyltrisiloxane and 30.2 g of methacryloyl chloride was used instead of 34.3 g of acryloyl chloride. The obtained monomer had a purity of 96% as determined by HPLC. (1H NMR: δ7.52, m, 6H; δ7.42, m, 4H; δ6.25, d, 2H; δ6.02, dd, 2H; δ5.82, t, 1H; δ5.59, d, 2H; δ3.86, m, 4H; δ1.52, m, 4H; δ0.58, m, 4H; δ0.04, m, 12H)

<Formula 4>

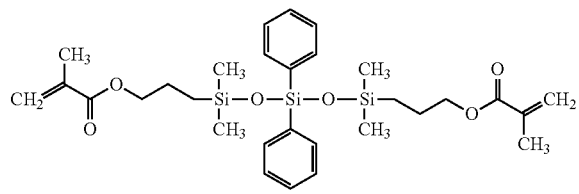

Preparative Example 3

A monomer (molecular weight: 646.99 g/mol) represented by Formula 5 was prepared in the same manner as in Preparative Example 1 except that 21 g of 3,3-diphenyl-1,1,5,5-tetramethyltrisiloxane was used instead of 25 g of 3-phenyl-1,1,3,5,5-pentamethyltrisiloxane. The obtained monomer had a purity of 94% as determined by HPLC. (1H NMR: δ7.61, m, 6H; δ7.12, m, 4H; δ6.25, d, 2H; δ6.02, dd, 2H; δ5.82, t, 2H; δ3.87, m, 4H; δ1.54, m, 4H; δ0.58, m, 4H; δ0.02, m, 12H).

<Formula 5>

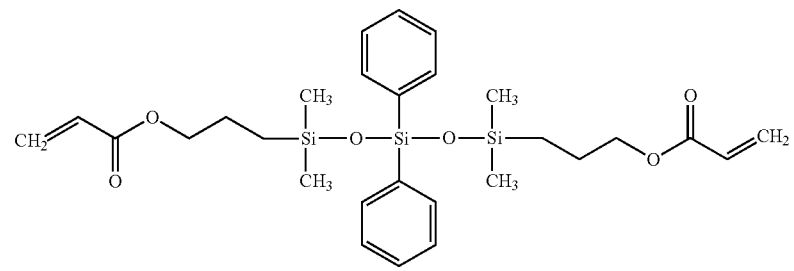

Details of components used in Examples and Comparative Examples were as follows.

(A) Non-silicon-based di(meth)acrylate: (A1) 1,12-dodecanediol dimethacrylate (Sartomer Co., Ltd.), (A2) 1,10-decanediol dimethacrylate (Shin Nakamura Chemical Co., Ltd.).

(B) Silicon-based di(meth)acrylate: (B1) monomer of Preparative Example 1, (B2) monomer of Preparative Example 2, (B3) monomer of Preparative Example 3.

(C) Mono(meth)acrylate: (C1) HRI-07 (Daelim Chemical Co., Ltd.), (C2) benzyl methacrylate (TCI Co., Ltd.), (C3) lauryl acrylate (Aldrich GmbH).

(D) Initiator: Darocur TPO (BASF GmbH).

(E) Heat stabilizer: IRGANOX 1010 (BASF GmbH).

(F) Monomer represented by Formula 10 (X-22-164, molecular weight: 460.78 g/mol, Shin-Etsu Co., Ltd.)

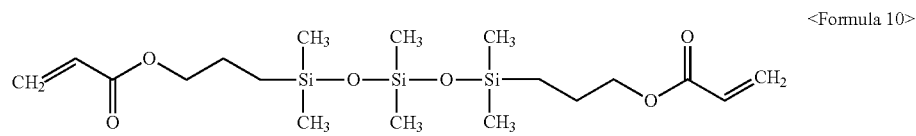 [SMILES: C=CC(=O)OCCC[Si](C)(C)O[Si](C)(C)O[Si](C)(C)CCCOC(=O)C=C]

<Formula 10>

Example 1

47.8 parts by weight of (A1), 28.7 parts by weight of (B1), 19.2 parts by weight of (C1) and 4.3 parts by weight of (D) were placed in a 125 ml brown polypropylene bottle, followed by mixing at room temperature for 3 hours using a shaker, thereby preparing an encapsulating composition (viscosity at 25° C.: 21 cPs).

Example 2 to Example 13 and Comparative Examples 1 to 4

Compositions for encapsulation materials were prepared in the same manner as in Example 1 except that kinds and/or amounts of (A), (B), (C), (D) and (E) were changed as listed in Table 1 (unit: parts by weight).

Comparative Example 5

An encapsulating composition was prepared in the same manner as in Example 1 except that 28.7 parts by weight of the (F) monomer was used instead of 28.7 parts by weight of the (B1) monomer of Preparative Example 1.

Each of the compositions for encapsulation materials prepared in Examples and Comparative Examples was evaluated as to properties as listed in Table 1. Results are shown in Tables 1 and 2.

TABLE 1

| | | Example | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| A | A1 | 47.8 | 47.8 | 38.8 | 38.8 | 47.8 | 48.5 | 38.25 | 38.8 | — | — | — | 47.8 | 47.8 |
| | A2 | — | — | — | — | — | — | — | — | 38.3 | 38.3 | 38.3 | — | — |
| B | B1 | 28.7 | 28.7 | 38.8 | 29.1 | — | — | — | — | 28.7 | — | — | — | — |
| | B2 | — | — | — | — | 28.7 | 29.1 | 38.25 | 29.1 | — | 28.7 | — | 28.7 | — |
| | B3 | — | — | — | — | — | — | — | — | — | — | 28.7 | — | 40.2 |
| C | C1 | 19.2 | 19.2 | 19.5 | 29.1 | 19.2 | 19.5 | 19.2 | 29.1 | 28.7 | 28.7 | 28.7 | — | — |
| | C2 | — | — | — | — | — | — | — | — | — | — | — | — | — |
| | C3 | — | — | — | — | — | — | — | — | — | — | — | 19.2 | 7.7 |
| D | | 4.3 | 4.3 | 2.9 | 3.0 | 4.3 | 2.9 | 4.3 | 3.0 | 4.3 | 4.3 | 4.3 | 4.3 | 4.3 |
| E (ppm) | | — | 750 | 750 | 750 | 750 | 750 | 750 | 750 | 750 | 750 | 750 | 750 | 750 |
| F | | — | — | — | — | — | — | — | — | — | — | — | — | — |
| Photocuring rate (%) | | 94.7 | 95.7 | 95.9 | 94.2 | 95.4 | 94.7 | 96.2 | 95.2 | 96.4 | 95.2 | 94.7 | 95.3 | 96.6 |
| Light transmittance (%) | | 93.5 | 93.7 | 93.8 | 94.6 | 94.2 | 94.2 | 94.6 | 94.4 | 95.2 | 96.1 | 95.8 | 94.8 | 95.2 |
| Plasma etching rate (%) | | 11.5 | 11.5 | 11.1 | 10.9 | 7.5 | 7.6 | 7.3 | 7.2 | 9.8 | 6.5 | 6.8 | 15.8 | 14.2 |

TABLE 2

|   |    | Comparative Example |      |      |      |      |
|---|----|------|------|------|------|------|
|   |    | 1    | 2    | 3    | 4    | 5    |
| A | A1 | 76.7 | 67.0 | 67.0 | 67.0 | 47.8 |
|   | A2 | —    | —    | —    | —    | —    |
| B | B1 | 16   | 28.7 | —    | —    | —    |
|   | B2 | —    | —    | —    | —    | —    |
|   | B3 | —    | —    | —    | —    | —    |
| C | C1 | 3    | —    | —    | —    | 19.2 |
|   | C2 | —    | —    | 28.7 | —    | —    |
|   | C3 | —    | —    | —    | 28.7 | —    |
| D |    | 4.3  | 4.3  | 4.3  | 4.3  | 4.3  |
| E(ppm) |  | —  | 750  | 750  | 750  | —    |
| F |    | —    | —    | —    | —    | 28.7 |
| Photocuring rate (%) | | 92.5 | 94.2 | 93.5 | 92.4 | 89.5 |
| Light transmittance (%) | | 91.5 | 90.4 | 87.5 | 86.5 | 91.8 |
| Plasma etching rate (%) | | 23.5 | 22.1 | 32.5 | 38.7 | 25.5 |

As shown in Table 1, the encapsulating composition according to the present invention could realize an organic layer exhibiting high photocuring rate, high light transmittance, and low plasma etching rate.

On the contrary, as shown in Table 2, the encapsulating composition of Comparative Example 1, which included (A), (B) and (C) in amounts outside the range according to the present invention, had a problem of high plasma etching rate. In addition, the encapsulating composition of Comparative Examples 2 to 4, which did not include any one of (B) and (C), also had a problem of high plasma etching rate. Further, the encapsulating composition of Comparative Example 5, which included the silicon-based di(meth)acrylate not containing an aryl group, also had a problem of high plasma etching rate Accordingly, the encapsulating composition used in the organic light emitting diode display apparatus according to the present invention exhibits high plasma resistance and thus provides better effects in prevention of damage caused by external factors than Comparative Examples, thereby securing excellent durability of the organic light emitting diode display apparatus according to the present invention.

<Evaluation of Properties>

(1) Photocuring rate: The encapsulating composition was measured as to the intensity of absorption peaks in the vicinity of 1635 cm$^{-1}$ (C=C) and 1720 cm$^{-1}$ (C=O) using FT-IR (NICOLET 4700, Thermo Co., Ltd.). The composition was coated onto a glass substrate using a sprayer, followed by UV curing through UV irradiation at 100 mW/cm$^2$ for 10 seconds, thereby obtaining a specimen having a size of 20 cm×20 cm×3 μm (width×length×thickness). Then, the cured film was aliquoted and the intensities of absorption peaks of the cured film were measured in in the vicinity of 1635 cm$^{-1}$ (C=C) and 1720 cm$^{-1}$ (C=O) using FT-IR (NICOLET 4700, Thermo Co., Ltd.). Photocuring rate was calculated by Equation 1:

Photocuring rate (%)=|1−(A/B)|×100

(wherein A is a ratio of the intensity of an absorption peak in the vicinity of 1635 cm$^{-1}$ to the intensity of an absorption peak in the vicinity of 1720 cm$^{-1}$ for the cured film; and B is a ratio of the intensity of an absorption peak in the vicinity of 1635 cm$^{-1}$ to the intensity of an absorption peak in the vicinity of 1720 cm$^{-1}$ for the encapsulating composition).

(2) Light transmittance: The encapsulating composition was subjected to UV curing under N$_2$ to form a 10 μm thick film. Next, light transmittance of the film in the visible light range of 550 nm was measured using a Lambda 950 (Perkin Elmer Co., Ltd.).

(3) Plasma etching rate: The encapsulating composition was coated to a predetermined thickness and photo-cured to form an organic layer, followed by measuring an initial coating height (T1, 1 μm to 10 μm) of the organic layer. The organic layer was subjected to plasma treatment under conditions of ICP power: 2500 W, RF power: 300 W, DC bias: 200V, Ar flow: 50 sccm, etching time: 1 min, and pressure: 10 mtorr, followed by measuring the height (T2, unit: μm) of the organic layer. The plasma etching rate of the organic layer was calculated by Equation 2:

Etching rate of organic layer due to plasma (%)= (T1−T2)/T1×100

It should be understood that various modifications, changes, alterations, and equivalent embodiments can be made by those skilled in the art without departing from the spirit and scope of the invention.

What is claimed is:

1. An organic light emitting diode display apparatus, comprising: a substrate; an organic light emitting diode disposed on the substrate; and an encapsulation layer encapsulating the organic light emitting diode,
wherein the encapsulation layer has a structure in which two or more inorganic layers and one or more organic layers are alternately stacked one above another, two adjacent inorganic layers at least partially contacting each other, the organic layers being formed of an encapsulating composition, and
wherein the encapsulating composition comprises about 10 wt % to about 70 wt % of (A) a non-silicon-based di(meth)acrylate, about 20 wt % to about 70 wt % of (B) a silicon-based di(meth)acrylate, about 5 wt % to about 40 wt % of (C) a mono(meth)acrylate, and about 1 wt % to about 10 wt % of (D) an initiator, the (B) silicon-based di(meth)acrylate being represented by Formula 1:

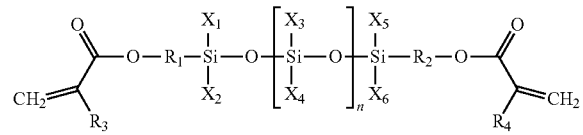

(where R$_1$ and R$_2$ are each independently a single bond, a substituted or unsubstituted C$_1$ to C$_{20}$ alkylene group, a substituted or unsubstituted C$_1$ to C$_{30}$ alkylene ether group, *—N(R')—(R'')—* (* representing a binding site for an element, R' being hydrogen or a substituted or unsubstituted C$_1$ to C$_{30}$ alkyl group, and R'' being a substituted or unsubstituted C$_1$ to C$_{20}$ alkylene group), a substituted or unsubstituted C$_6$ to C$_{30}$ arylene group, a substituted or unsubstituted C$_7$ to C$_{30}$ arylalkylene group, or *—(R')—O—** (* representing a binding site for O in Formula 1, ** representing a binding site for Si in Formula 1, and R' being a substituted or unsubstituted C$_1$ to C$_{30}$ alkylene group);
X$_1$, X$_2$, X$_3$, X$_4$, X$_5$ and X$_6$ are each independently hydrogen, a hydroxyl group, a halogen, a cyano group, a substituted or unsubstituted C$_1$ to C$_{30}$ alkyl group, a substituted or unsubstituted C$_1$ to C$_{30}$ heterocycloalkyl group, a substituted or unsubstituted C$_3$ to C$_{30}$ cycloalkyl group, a substituted or unsubstituted C$_1$ to C$_{30}$ alkyl ether group, *—N(R')—(R'')—* (* representing a binding site for an element, and R' and R'' being each independently hydrogen or a substituted or unsubstituted C$_1$ to C$_{30}$ alkyl group), a substituted or unsubstituted $C_1$ to $C_{30}$ alkyl sulfide group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group;

at least one of $X_1$, $X_2$, $X_3$, $X_4$, $X_5$ and $X_6$ is a substituted or unsubstituted $C_6$ to $C_{30}$ aryl group, or a substituted or unsubstituted $C_2$ to $C_{30}$ heteroaryl group;

$R_3$ and $R_4$ are each independently hydrogen or a methyl group; and n is an integer from 0 to 30, or ranges from 0 to 30 on average).

2. The organic light emitting diode display apparatus according to claim 1, wherein the inorganic layers comprises a first inorganic layer and a second inorganic layer; the organic layer comprises a first organic layer; and the encapsulation layer comprises the first inorganic layer, the first organic layer, and the second inorganic layer alternately stacked one above another.

3. The organic light emitting diode display apparatus according to claim 2, wherein the encapsulation layer has a structure in which the first inorganic layer and the second inorganic layer are sequentially stacked at an edge thereof.

4. The organic light emitting diode display apparatus according to claim 2, wherein the first inorganic layer and the second inorganic layer have the same area.

5. The organic light emitting diode display apparatus according to claim 2, wherein the second inorganic layer is formed to surround the first organic layer.

6. The organic light emitting diode display apparatus according to claim 1, wherein the inorganic layers have the same area or a gradually increasing area with increasing distance from the organic light emitting diode.

7. The organic light emitting diode display apparatus according to claim 1, wherein each of the organic layers has a thickness of about 0.2 μm to about 15 μm.

8. The organic light emitting diode display apparatus according to claim 1, wherein the inorganic layers comprise at least one of silicon oxide, silicon nitride, silicon oxynitride, ZnSe, ZnO, $Sb_2O_3$, $Al_2O_3$, $In_2O_3$, and $SnO_2$.

9. The organic light emitting diode display apparatus according to claim 1, wherein the composition comprises about 10 wt % to about 50 wt % of the (A) non-silicon-based di(meth)acrylate, about 20 wt % to about 70 wt % of the (B) silicon-based di(meth)acrylate, about 5 wt % to about 40 wt % of the (C) mono(meth)acrylate, and about 1 wt % to about 10 wt % of the (D) initiator, based on a total weight of (A), (B), (C) and (D).

10. The organic light emitting diode display apparatus according to claim 1, wherein, in Formula 1, $R_1$ and $R_2$ are each independently a single bond, a substituted or unsubstituted $C_1$ to $C_{20}$ alkylene group, or a substituted or unsubstituted $C_1$ to $C_{30}$ alkylene ether group; $X_1$, $X_2$, $X_3$, $X_4$, $X_5$, and $X_6$ are each independently hydrogen, a substituted or unsubstituted $C_1$ to $C_{30}$ alkyl group, a substituted or unsubstituted $C_3$ to $C_{30}$ cycloalkyl group, a substituted or unsubstituted $C_1$ to $C_{30}$ alkyl ether group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group; and at least one of $X_1$, $X_2$, $X_3$, $X_4$, $X_5$ and $X_6$ is a substituted or unsubstituted $C_6$ to $C_{30}$ aryl group.

11. The organic light emitting diode display apparatus according to claim 1, wherein the (B) silicon-based di(meth)acrylate is represented by one of Formula 3 to Formula 8:

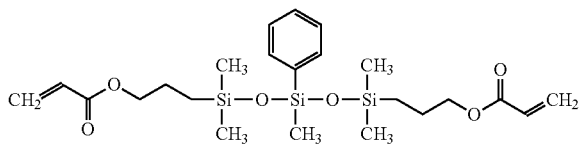
<Formula 3>

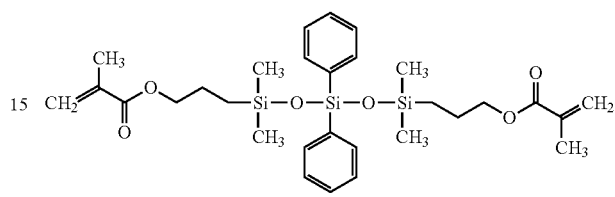
<Formula 4>

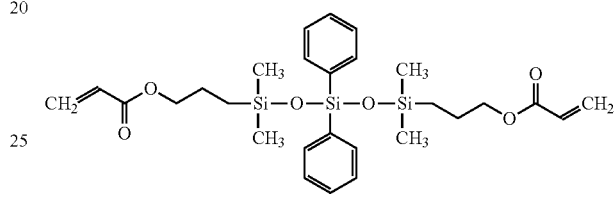
<Formula 5>

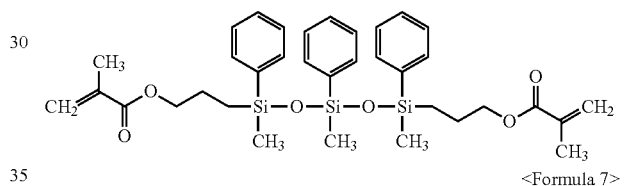
<Formula 6>

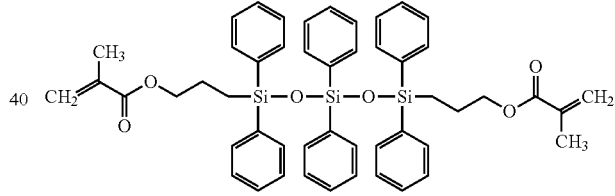
<Formula 7>

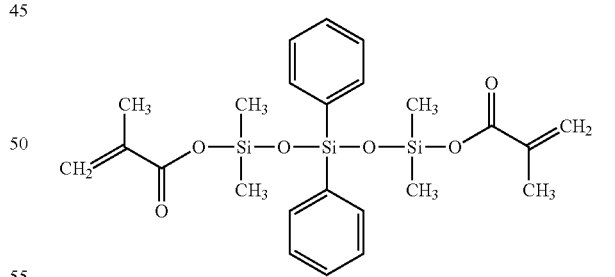
<Formula 8>

12. The organic light emitting diode display apparatus according to claim 1, wherein the (A) non-silicon-based di(meth)acrylate is represented by Formula 2:

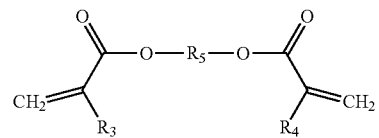

(where R₃ and R₄ are each independently hydrogen or a methyl group, and R₅ being a substituted or unsubstituted $C_1$ to $C_{20}$ alkylene group).

13. The organic light emitting diode display apparatus according to claim 1, wherein the (C) mono(meth)acrylate comprises at least one of a non-silicon (meth)acrylate, an aromatic mono(meth)acrylate, and a non-aromatic mono(meth)acrylate.

14. The organic light emitting diode display apparatus according to claim 1, wherein the encapsulating composition further comprises a heat stabilizer.

15. The organic light emitting diode display apparatus according to claim 1, wherein the (A) non-silicon-based di(meth)acrylate comprises a $C_1$ to $C_{20}$ alkylene group-containing di(meth)acrylate; the (B) silicon-based di(meth)acrylate is represented by one of Formula 3 to Formula 8:

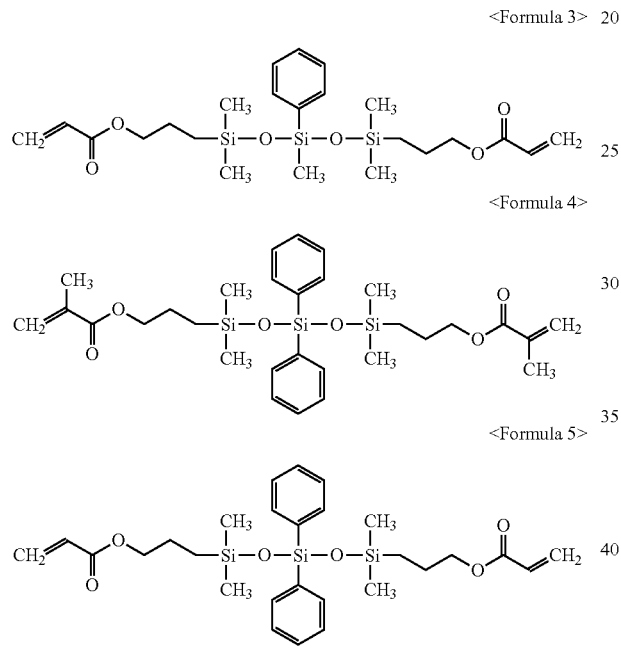

<Formula 3>
<Formula 4>
<Formula 5>

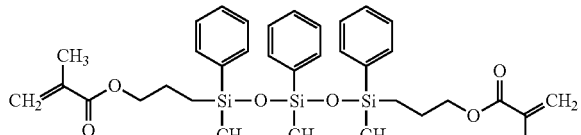

<Formula 6>

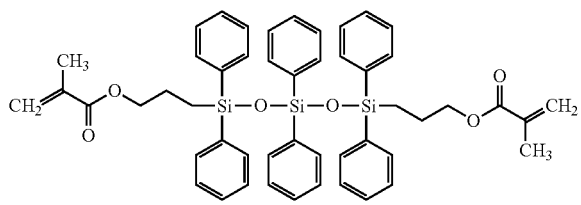

<Formula 7>

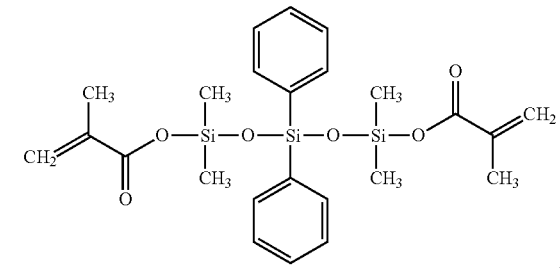

<Formula 8> the (C) mono(meth)acrylate is represented by Formula 9:

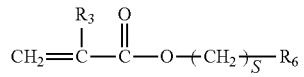

(where R₃ is hydrogen or a methyl group; s is an integer from 0 to 10; and R₆ being a substituted or unsubstituted $C_6$ to $C_{50}$ aryl group or a substituted or unsubstituted $C_6$ to $C_{50}$ aryloxy group); and
the (D) initiator comprises a phosphorus initiator.

* * * * *